United States Patent [19]

Russell

[11] Patent Number: 4,618,833

[45] Date of Patent: Oct. 21, 1986

[54] OPERATIONAL AMPLIFIER OFFSET TRIM THAT DOES NOT CHANGE THE OFFSET POTENTIAL TEMPERATURE DRIFT

[75] Inventor: Ronald W. Russell, Sunnyvale, Calif.

[73] Assignee: National Semiconductor Corporation, Santa Clara, Calif.

[21] Appl. No.: 764,450

[22] Filed: Aug. 12, 1985

[51] Int. Cl.⁴ .............................................. H03F 3/45
[52] U.S. Cl. .................................. 330/256; 330/260; 330/289
[58] Field of Search .................. 330/9, 149, 253, 256, 330/260, 289

[56] References Cited

FOREIGN PATENT DOCUMENTS 0101245 8/1979 Japan .................................. 330/256

Primary Examiner—Gene Wan
Attorney, Agent, or Firm—Gail W. Woodward; Paul J. Winters

[57] ABSTRACT

A JFET operational amplifier input stage is disclosed along with am offset potential trimming circuit. The trimming circuit includes a scaled down compensation stage that is modeled after the input stage and provided with a constant temperature independent bias. This generates a trimming current that varies with temperature inversely with the transconductance of the input stage. A control circuit applies a digitally controlled portion of the trimming current to the input stage so as to compensate the offset potential. The input offset potential is therefore compensated without changing the offset potential temperature drift. Desirably the compensation is achieved after device assembly.

6 Claims, 1 Drawing Figure

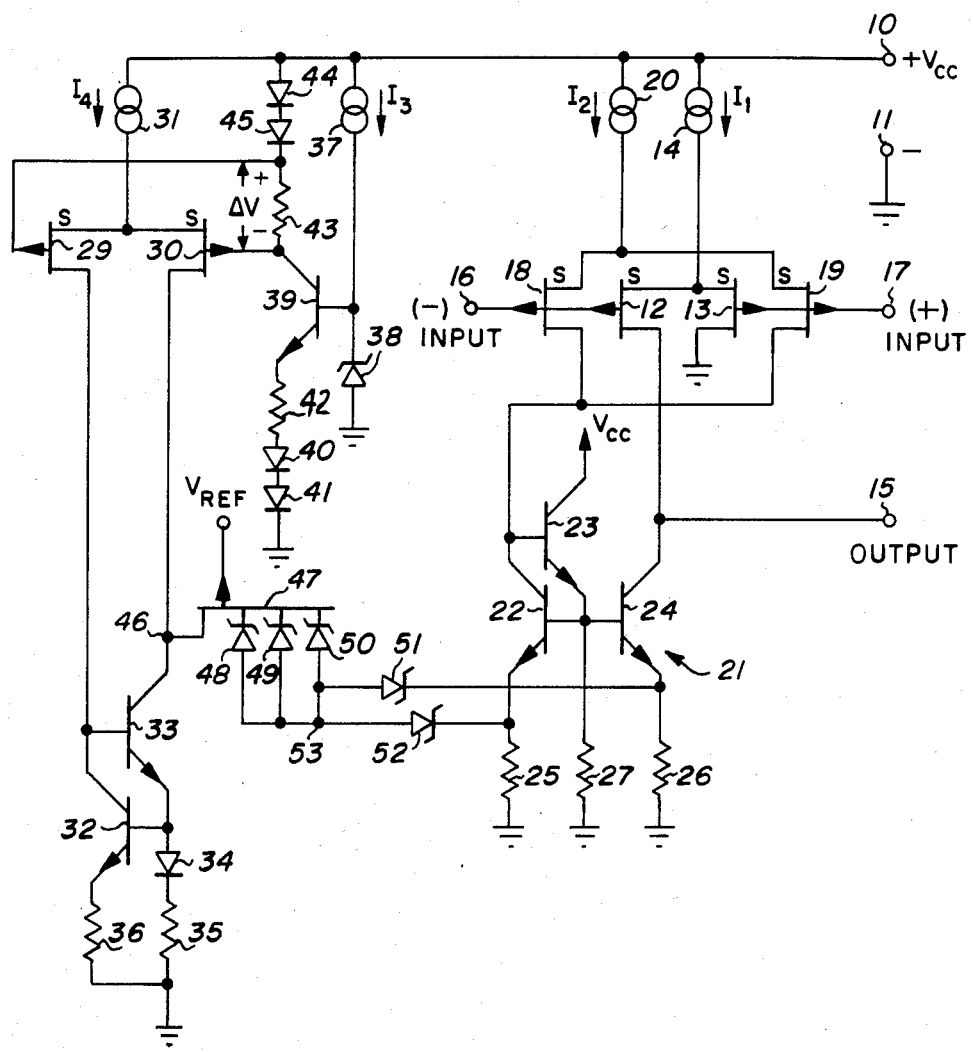

OPERATIONAL AMPLIFIER OFFSET TRIM THAT DOES NOT CHANGE THE OFFSET POTENTIAL TEMPERATURE DRIFT

BACKGROUND OF THE INVENTION

My U.S. Pat. No. 4,050,030, issued Sept. 20, 1977, to the assignee of the present invention. This patent describes an OFFSET ADJUSTMENT CIRCUIT that can be used to trim the offset of a differential amplifier having JFET input devices. The circuit provides for the use of an external trimming element which produces the trim and the circuit itself provides for cancellation of the offset drift that results from temperature changes.

U.S. Pat. No. 4,496,963, by Robert C. Dobkin and James L. Dunkley is titled SEMICONDUCTOR DEVICE WITH AN ION IMPLANTED STABILIZATION LAYER and issued on Jan. 29, 1985, to the assignee of the present invention. This patent teaches ion implantation and claims the JFET structure that can be incorporated into conventional IC devices.

U.S. Pat. No. 4,079,402, by James E. Solomon and James L. Dunkley, is titled ZENER DIODE INCORPORATING AN ION IMPLANTED LAYER ESTABLISHING THE BREAKDOWN POINT BELOW THE SURFACE, and issued Mar. 14, 1978, to the assignee of the present invention. This patent teaches the use of an ion implanted layer in the fabrication of buried zener diodes adapted for incorporation into IC structures.

The teaching in the above three patents is incorporated herein by reference.

It would be desirable to incorporate a trimming circuit into an operational amplifier IC in which all of the elements are on the chip and in which trimming can be accomplished at either wafer sort or after packaging.

SUMMARY OF THE INVENTION

It is an object of the invention to incorporate a trimming circuit into an IC operational amplifier using on-chip components.

It is a further object of the invention to fabricate a JFET input stage IC operational amplifier in which a scaled down version of the input stage is employed to develop a trimming current that is used to compensate the input stage offset potential without changing the offset potential temperature drift.

It is a still further object of the invention to incorporate an on-chip trimming circuit for trimming the input offset potential of an IC operational amplifier using a digitally controlled trim which can be applied at either wafer sort or after assembly.

These and other objects are achieved in a JFET operational amplifier input stage. The input stage includes a pair of JFET's operated differentially and having a current mirror load providing a single-ended output. The input stage is duplicated in a scaled down version that produces a temperature related trim current. The scaled down version is operated at a reduced tail current and is provided with a constant input voltage that unbalances its conduction. The scaled down circuit current density duplicates that of the input stage and produces a trim current drift that will match the offset drift of the input stage. The scaled down circuit includes an output control circuit that provides a digital control of the trim current using a group of zener zap diodes. The controlled trim current is fed to the JFET input stage and is applied in a sense that will compensate the offset potential. After the IC has been fabricated, the input offset potential is measured and desired compensation determined. The appropriate zener zapping is then accomplished to achieve the desired reduction in offset potential. If desired, the compensation can be achieved after the IC is packaged so that assembly-induced offset can be compensated.

BRIEF DESCRIPTION OF THE DRAWING

The single FIGURE of drawing is a schematic diagram of the circuit of the preferred embodiment of the invention.

DESCRIPTION OF THE INVENTION

The schematic diagram of the drawing shows a JFET operational amplifier input stage and its offset trimming circuit. The circuit is operated from a $V_{CC}$ power supply connected + to terminal 10 and − to ground terminal 11.

JFET's 12 and 13 comprise a matched pair which form a differential input amplifier stage. Their sources are coupled together to current source 14 which passes tail current $I_1$. The stage output at terminal 15 is single-ended. Inverting and non-inverting input terminals 16 and 17 respectively comprise the stage input terminals.

JFET's 18 and 19 are also differentially coupled to input terminals 16 and 17 and their tail current, $I_2$, is supplied by current source 20. In the preferred embodiment source 20 operates at one-half of source 14 and JFET's 18 and 19 are made to have half of the widths of JFET's 12 and 13. Thus, the JFET current densities are the same.

The drains of transistors 18 and 19 are connected together to the input of current mirror load 21. Transistor 22 is forced to operate as a diode by emitter follower transistor 23. Resistors 25 and 26 are respectively coupled in series with the emitters of transistors 22 and 24. Resistor 27 returns the emitter of transistor 23 to ground. If resistor 25 matches resistor 26 and if transistor 24 matches transistor 22, current mirror 21 will form a highly accurate, unity-gain, current mirror. As pointed out above, transistors 18 and 19 are half-width devices and the input current $I_2$ to current mirror 21 is $I_1$. This arrangement ensures the desired current balance in the input stage and enhances the common mode rejection characteristic.

When signals are applied to terminals 16 and 17, the output signal at terminal 15 will be related to the differential input and substantially independent of the common mode input.

JFET's 29 and 30 form a simulated input stage and are connected differentially. Current source 31 supplies $I_4$, the tail current. In the preferred embodiment transistors 29 and 30 are built like transistors 12 and 13, but on a much smaller scale. Tail current source 31 is ratioed with respect to source 14 by the same ratio as the transistor sizes so that all of the transistors 12, 13, 29 and 30 operate at the same current density. Transistors 32 and 33 along with diode 34 and resistors 35 and 36 form a high-accuracy, unity-gain, current mirror load for transistors 29 and 30. Thus, node 46 is a single-ended output for the simulated input stage.

Transistors 29 and 30 are provided with a constant differential input, $\Delta V$, which is developed as follows. Current source 37 supplies $I_3$ which biases zener diode 38 into its reverse breakdown which is about 7 volts at 300° K. Such zener diodes have a positive temperature coefficient of about 3 mV/°C. The series combination of the $V_{BE}$ of transistor 39 and diodes 40 and 41 subtract from the zener voltage to provide about 5.8 volts across resistor 42. Since a forward biased diode develops a voltage drop of about 600 mV at 300° K. and has a temperature coefficient of about −2 mV/°C., this 5.6 volts has a positive temperature coefficient of about 9 mV/°C. If resistor 42 is constructed using semiconductor diffused material of NPN transistor base resistivity, it will have a matching positive temperature coefficient of resistance. Thus, the current through resistor 42 will be constant and substantially independent of temperature. This constant current also flows in resistor 43 to develop ΔV. If resistor 43 is composed of heavily doped semiconductor material, such as is used in NPN transistor emitters, its temperature coefficient will be close to zero. Therefore, ΔV will be constant and substantially independent of temperature. In the preferred embodiment ΔV will be made about 100mV. Diodes 44 and 45 return resistor 43 to $+V_{CC}$.

Since the gate of transistor 30 is below the gate of transistor 29, the bulk of $I_4$ flowing in source 31 will flow in transistor 30. The magnitude of this current will vary with temperature in accordance with the thermal behavior of transistors 29 and 30.

Circuit node 46 is directly connected to the source of JFET 47 which is shown having three drains. These drains are proportionally related as will be described hereinafter, Zener diodes 48-50 are coupled in series with the three JFET drains. The gate of JFET 47 is returned to $V_{REF}$ which is selected to be at a value which will insure that the zener voltage of diodes 48-50 will not be exceeded. While not shown, it is to be understood that each of zener diodes 48-52 has its terminals brought out to an IC bonding pad. Node 53 provides a common pad connection to all of the diodes. Then, if trimming is desired at wafer sort, probe connection to the bonding pads can be employed in the conventional zener zapping. However, if post-assembly trimming is desired, the zener diode bonding pads will be connected to the package pins so that an external connection is available for zener zapping. Thus, in the initial state zener diodes 48-52 will be open and no output current from node 46 will flow. However, any combination of zener diodes 48-50 can be zapped by the application of a suitable voltage and current after which that diode (or diodes) will be shorted and it will thereafter conduct the current flowing in the related drain (or drains) of transistor 47. Thus, the zener diodes act as switches. In addition, either diode 51 or 52 can be zapped (but not both) so that the offset correction current can be applied to either resistor 25 or 26. If the current is applied to resistor 26 by zapping diode 51 it will directly affect the d-c potential at terminal 15. However, if diode 52 is zapped the current will be applied to resistor 25 which has the opposite polarity effect at terminal 15. As pointed out above, JFET 47 has three digitally related drains, each one coupled by means of a zener diode. If the JFET drains have the relationship of 1, 2 and 4 respectively, diodes 48-50 can be zapped to select any current integer between zero and 7. Thus, with the action of diodes 51 and 52, the circuit can apply an offset trim at any integer between ±7.

In operation the circuit will be manufactured and the offset voltage of the input stage including transistors 12 and 13 measured. If the offset voltage is within specification, nothing further is done. If it is out of specification one or more of zener diode 48-50 is zapped. The particular ones being determined by how far the offset is out of specification. Also, one diode, 51 or 52, is zapped depending upon the sign of the offset.

The above-described trimming can be emloyed at wafer sort during IC manufacture. However, the packaging operations that follow wafer sort can introduce offset errors that are not present at wafer sort. It has been proposed that the die mounting, which commonly involves soldering the IC chip to a metal surface, can induce strains in the chip that significantly affect the thin JFET circuit elements. Accordingly, it is desirable to perform the trim after IC assembly. In such a case, the five zener diodes 48-52 are all connected to the IC package pins. The common connection at node 53 is also brought out to a separate pin. Then, after the final assembly is finished, the offset is measured and the appropriate zener diodes zapped to reduce the offset.

EXAMPLE

The circuit of the drawing was implemented in conventional monolithic silicon, PN junction isolated, IC form. The NPN transistors were of conventional vertical construction and had Beta values in excess of 200. The JFETs were conventional ion implanted p-channel structures as set forth in U.S. Pat. No. 4,496,963. The zener diodes were of buried junction structures as set forth in U.S. Pat. No. 4,079,402. The other diodes were conventional transistors having their collectors connected to their bases. The following component values were used.

| COMPONENT | VALUE | UNITS |
| --- | --- | --- |
| Current Source 14 | 600 | microamperes |
| Current Source 20 | 300 | microamperes |
| Resistors 25, 26 | 600 | ohms |
| Resistor 27 | 1.9K | ohms |
| Resistors 35, 36 | 2K | ohms |
| Current Source 31 | 30 | microamperes |
| Current Source 37 | 50 | microamperes |
| Resistor 42 | 12K | ohms |
| Resistor 43 | 240 | ohms |

The completed IC's could be trimmed to better than 0.25 millivolt offset at 300° K. without changing the offset voltage temperature drift which was typically about 10 microvolts per degree centigrade.

The invention has been described and a working example given. When a person skilled in the art reads the foregoing description, alternatives and equivalents, within the spirit and intent of the invention, will be apparent. For example, while a JFET operational amplifier is shown, the concepts can be applied to bipolar transistor input circuits. Accordingly, it is intended that the scope of the invention be limited only by the following claims.

I claim:

1. A differential amplifier circuit including a differentially connected input transistor pair which has an offset potential that drifts with temperature change and an offset trimming circuit which reduces said offset potential to an acceptable value without changing the offset potential temperature drift, said offset trimming circuit comprising:

a compensation transistor pair connected as a differential amplifier;

means for applying a constant, temperature independent, input potential to said compensation transistor pair thereby to unbalance conduction in said compensation pair and to develop a compensation current related to the unbalanced conduction in said compensation pair and which varies with temperature inversely with the transconductance in said input transistor pair; and means for coupling a portion of said compensation current to said input transistor pair wherein said portion is coupled to reduce said offset potential.

2. The differential amplifier circuit of claim 1 wherein said compensation transistor pair of operated at the same current density as said input transistor pair.

3. The differential amplifier circuit of claim 2 wherein said input transistor pair is sized to provide an optimum performance of said differential amplifier and said compensation transistor pair is scaled down in size and operated at a tail current that is a fraction of the value of the tail current of said input transistor pair with said fraction being equal to the device scaling factor.

4. The differential amplifier circuit of claim 3 wherein said input and compensation transistors are JFET devices.

5. The differential amplifier circuit of claim 1 wherein said means for coupling includes means for coupling one or more of a plurality of digitally related portions of said compensation current to a common circuit node and means for selectively coupling said common circuit node to said input transistor pair either additively or substractively.

6. The differential amplifier circuit of claim 5 wherein said means for coupling includes a plural drain JFET having its source coupled to receive said compensation current from said compensation transistor pair, a zener diode coupled between each of said plural drains and a common circuit node, and a pair of zener diodes coupled between said common circuit node and said input transistor pair whereby said zener diodes can be selectively zapped to achieve said offset trimming.

* * * * *